United States Patent [19]

Klein et al.

[11] Patent Number: 4,680,774

[45] Date of Patent: Jul. 14, 1987

[54] METHOD AND CIRCUIT FOR SUPPRESSION OF QUANTITIZING NOISE AMBIGUITIES

[75] Inventors: Karl-Heinz Klein, Wiesbaden-Erbenheim; Wilfried Richter, Rossdorf, both of Fed. Rep. of Germany

[73] Assignee: Robert Bosch GmbH, Stuttgart, Fed. Rep. of Germany

[21] Appl. No.: 819,891

[22] Filed: Jan. 16, 1986

[30] Foreign Application Priority Data

Feb. 13, 1985 [DE] Fed. Rep. of Germany ....... 3504762

[51] Int. Cl.⁴ .............................................. H03M 1/66
[52] U.S. Cl. ............................ 375/26; 340/347 DA; 370/77
[58] Field of Search ............. 375/26, 34; 340/347 CC, 340/347 DA; 370/77

[56] References Cited

U.S. PATENT DOCUMENTS 3,927,372 12/1975 Zschunke ............................... 375/26
4,559,523 12/1985 Wakita ........................... 340/347 AD
4,590,458 5/1986 Evans et al. ................... 340/347 CC Primary Examiner—Benedict V. Safourek
Attorney, Agent, or Firm—Frishauf, Holtz, Goodman & Woodward

[57] ABSTRACT

To suppress quantitizing ambiguities upon digital transmission of an analog signal, a random access memory (RAM) (13) is connected at the end terminal of a digital transmission line, and has its output connected to an adder stage (15). The adder stage adds the digital value of +1 to the output from the RAM (13). The value of the digitized data word, incremented by +1, is then compared in a subsequent interrogation cycle of the value at the input to the memory and only if the deviation is greater than ±1, a comparator, effecting the comparison, provides a "store" signal for transfer of the new value to the RAM (13). The D/A converters, only then, are changed to provide a changed output analog signal.

13 Claims, 2 Drawing Figures

METHOD AND CIRCUIT FOR SUPPRESSION OF QUANTITIZING NOISE AMBIGUITIES

Reference to related publication: German Patent Disclosure Document DE-OS No. 31 04 247.

The present invention relates to conversion of data between digital and analog form, and more particularly to a method and a circuit to decrease, and preferably entirely eliminate quantitizing errors which arise upon conversion or transmission of initially analog signals into digital form, to permit, if desired, reconversion of the digitized signals into analog form with minimum or no noise quantitizing error, so that analog signal will not be subject to continued quantitizing noise.

BACKGROUND

Conversion of an analog signal to digitally coded form results in a finite number of quantitizing steps, even if the characteristic of the utilized analog/digital (A/D) converter is ideal. The errors arise in the region of the least significant bits (LSBs). The quantitizing errors are due to the finite number of quantitizing steps of the signal. A discrete value of an analog signal may be represented in digital form, after quantitizing and coding into the digital form by a predetermined digital value represented by a data word of a predetermined value; alternatively, it may be represented by an immediately adjacent data word. The analog signal value, however, actually, may be between both the first data word value as well as the immediately adjacent data word value. It is, thus, a matter of chance or random occurrence whether, in temporally sequential digitizing circuits, the respective analog value is represented by the first data word, or the next adjacent data word. In case of low analog signal levels, the quantitizing ambiguity of $\pm\frac{1}{2}$ LSB becomes noticeable based on a percentage of data words being considered. If the analog signal only has low-frequency components, the quantitizing ambiguity becomes cumulative.

Reduction of noise in a reconverted analog signal which had previously been digitized is described for example in German Patent Disclosure Document DE-OS No. 31 04 247. In the there described process, the quantitizing error which occurs upon digitizing an analog signal is intended to be reduced. It is first determined when an if a digital signal includes only low-frequency information; if the answer to the interrogation is "yes", adjacently positioned interrogation values of the signal are averaged by a filter in order to reduce the noise level or noise content. The system has a disadvantage, namely of reducing the resolution of the analog signal since two or more adjacent interrogation values are averaged. This reduction in resolution is undesirable. Conversion of analog signals to digital form and subsequent re-conversion is frequently desirable, since signals can be transmitted over a transmission system easier in digital than in analog form.

THE INVENTION

It is an object to reduce or entirely eliminate quantitizing noise errors arising in A/D and D/A conversion and reconversion without reducing the temporal resolution of sequential digital values.

Briefly, sequential digital signals, for example first and second digital signals, are analyzed and discriminated to determine if they are similar or dissimilar; the digital/analog (D/A) reconversion is then so controlled to change, after a reconversion from the first digital signal to an analog signal, reconversion of a subsequent digital signal to a subsequent temporally occurring analog signal only if the degree of discrimination of the dissimilarity reaches or exceeds a predetermined level.

In accordance with a feature of the invention, a change of more than $+1$ LSB or les than $-0$ LSB is required in order to change the analog output signal from the output of the D/A converter, which reconverts the digital signal to an analog signal.

In accordance with a feature of the invention, a circuit is provided which includes either a random access memory (RAM) or a programmable read-only memory (PROM) to store analog values for carrying out subsequent comparisons.

The system has the advantage that the quantitizing noise or quantitizing errors upon reconversion are substantially reduced, without decreasing the temporal resolution of sequentially occurring digital signals. An additional advantage is that any remaining quantitizing noise or errors can become effective only in one direction and, if the initial analog signal stays constant, only once.

DRAWINGS

DETAILED DESCRIPTION

Figure 1:
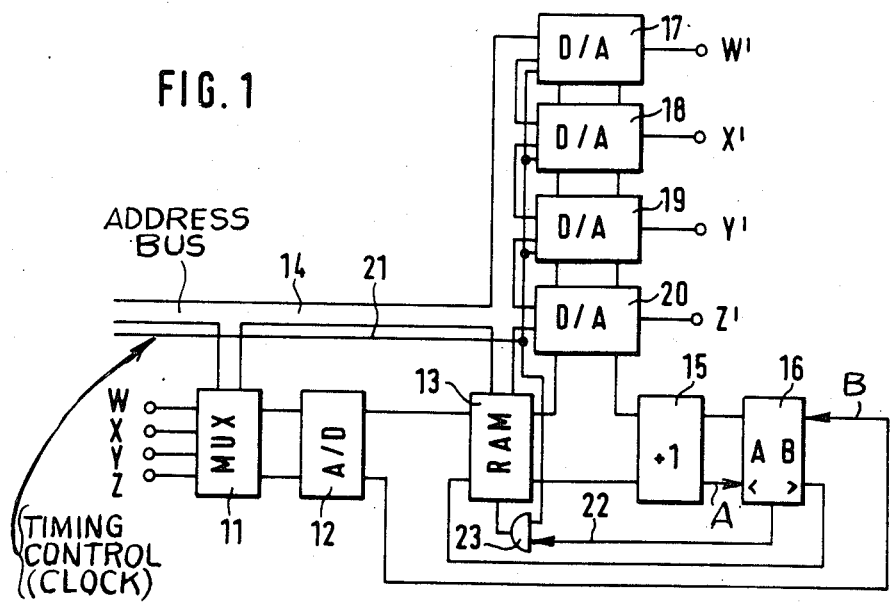
FIG. 1 is a schematic diagram of a circuit carrying out the method.

A multiplexer 11—FIG. 1—has four inputs which have analog signals W, X, Y, Z applied thereto. The output of the multiplexer 11 is connected to an A/D converter 12 from which signal portions derived from the signals W, X, Y, A are temporally sequentially applied thereto and there changed into digital interrogation data words. The circuit further includes a random access memory (RAM) 13, in which the digital interrogation value, now digitized data words, derived from the A/D converter 12, are stored in suitable addresses, derived from an address bus 14. A timing control or clock bus 21 is further provided, the address buses 14, 21 being suitably connected to a control unit in accordance with well kwown and standard A/D and D/A technology. The output of the RAM 13 is connected to an adder 15. The adder adds one LSB to the data words derived from the output of the RAM 13. A data word, so incremented by the adder 15, is connected to an input A of a comparator 16.

The data words derived from the output of the A/D converter 12 are, additionally and simultaneously, connected to the input B of the comparator 16. Comparator 16 thus continuously compares the significance of the data words from the ouput of the A/D converter 12 with the value or significance of the data words from the output of the adder 15 and incremented by one LSB.

The RAM 13 is further connected to a group of D/A converters 17, 18, 19, 20.

METHOD AND OPERATION

Upon connection of the system, the value at the output of the RAM 13 will be zero. The comparator input A, thus, will have the value of $+1$ thereon. The analog input signal which is converted in the A/D converter 12 is applied to the input B of the comparator 16. Discrimination between the two inputs A, B, or comparison between the two inputs, will determine if the inputs are the same or dissimilar. If dissimilarity of 1 is determined, the data word is transferred into the RAM 13, and the respective D/A converter 17, 18, 19 or 20, as determined by the address word on the address bus 14, is correspondingly influenced. The value of the memory content, now increased by one LSB, is available at the input A of the comparator 16. After the next interrogation cycle, the new data word is applied to the input B of the comparator 16. A change in the memory content, and thus a resetting of the corresponding D/A converters 17, 18, 19 or 20, will occur only if there is non-congruence or dissimilarity of the significance of the LSB of the data word from the memory.

A specific case may arise, namely that the data word is equal to the memory content. In this situation, the data word is applied to the RAM 13, but the corresponding D/A converter 17, 18, 19, 20 does not change its condition.

The method and the system thus achieve that quantitizing noise ambiguities can affect the result only in one direction and, if the analog signal remains the same, can occur only once within the first interrogation cycle. Thereafter, a change of more than +1 LSB or less than −0 LSB is necessary in order to influence the corresponding D/A converter 17, 18, 19 or 20.

The control line 21 is provided in order to provide for proper temporal "housekeeping" and sequencing of the data flow or data words within the circuit. The control line 21 is connected to the RAM 13, as well as to the D/A converters 17-20 and control the respective elements over suitable clock input terminals. The clocking of such a system and the control is well known.

The comparator 16 provides a signal to the line 22 only if the comparison of the significance of the data words at the inputs A and B indicates dissimilarity, that is, if the discrimination between the data words shows non-congruence of the significance of the data words. Line 22 is connected to one input of an AND-gate 23, the other input of which is connected to the timing control or clock bus 21. The output of the AND-gate 23 is connected to the "store" input of the RAM 13, so that the RAM 13 will store a data word from the A/D converter 12 only when it differs within the corresponding interrogation cycles by more than one LSB from a preceding data word.

Figure 2:
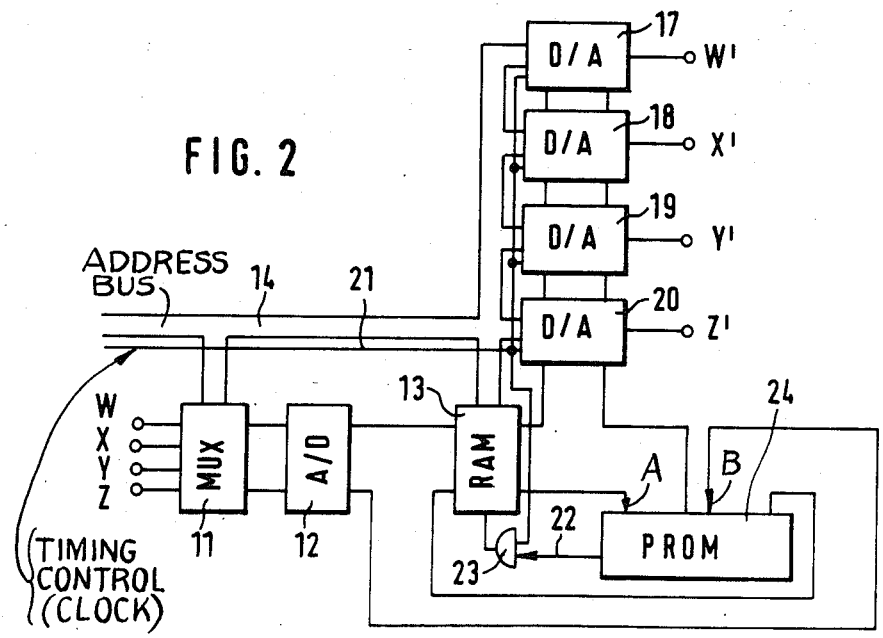
FIG. 2 is a circuit similar to FIG. 1 and illustrating another embodiment.

The embodiment of FIG. 2 is similar to that of FIG. 1 and similar circuit components are indicated by the same reference numerals and will operate similarly. The function of the adder 15 and the comparator 16 of FIG. 1 is replaced by a single PROM 24 which generates the "store" or transfer signal for the RAM 13. For example, 16 bits for the respective address, and 1 bit for data content, may be provided.

Various changes and modifications may be made, and the method can be instrumented in different ways. For example, multiplexer 11 may generate a time-multiplex signal sequence, or, alternatively, a signal sequence or signal train which is simultaneously transmitted in frequency multiplex mode. The number of the D/A converters will be suitably selected in accordance with requirements of the data, that is, in dependence on the number of the required output lines for the analog signals. The analog signal output lines are shown in the Figures at W', X', Y', Z'.

Various other changes and modifications may be made within the scope of the inventive concept. For example, the connecting lines between the A/D converter 12 and the RAM 13 and the comparator 16, respectively, can be combined to form an extended digital signal transmission line, with the RAM 13 located, physically, close to and in association with the D/A converters 17-20, so that the reconverted analog outputs W' ... Z' will be available at a physically different location from that of the A/D converter 12.

We claim:

1. Method to reduce or eliminate quantitizing noise errors upon digital transmission of analog signals by analog/digital (A/D) conversion, transmission of digital signals, and subsequent digital/analog (D/A) reconversion into analog signals, with minimum or no distortion between the original analog signal and the reconverted analog signal, comprising, in accordance with the invention, the steps of storing a first digitized signal representative of a first analog value;

comparing first and second sequential digitized signals, discriminating between similar and dissimilar digital signal values and determining the degree of dissimilarity;

and controlling the D/A conversion to change a conversion of the second digitized signal to an analog signal with respect to the first stored signal only if the discriminated degree of dissimilarity exceeds a predetermined level.

2. Method according to claim 1, including the step of storing the transmitted digital signals;

incrementing the transmitted signal by a predetermined incremental value;

and wherein the step of comparing the first and second digitized signals comprises comparing the stored transmitted digital signal with the incremented digital signal;

and further including the step of storing a new signal value in a memory (RAM) (13).

3. Method according to claim 1, wherein the step of storing the value of a first digitized signal comprises storing said signal in a volatile memory (RAM) (13); and including the step of incrementing the stored value by a predetermined value, and wherein the step of discriminating between similar and dissimilar sequential digitized signal values comprises comparing the second sequential digitized signal with the incremented first digitized signal; and changing the value of the stored signal by the increment if the discriminated degree of dissimilarity exceeds the increment.

4. Method according to claim 3, including the step of storing the first digitized signal in the volatile memory (RAM) (13);

wherein the step of incrementing the first signal value comprises incrementing the stored value by said increment, and the comparison and discriminating step comprises comparing the digitized signals originally stored in the volatile memory and the incremented signals, and controlling the memory to provide a "store" signal when the degree of dissimilarity exceeds the predetermined level.

5. Method according to claim 4, wherein the incrementing step comprises reading the first stored digitized signal from the volatile memory (RAM) (13) and applying said value to an adder (15); adding an increment value to provide said incremented digitized signal for comparison with the second digitized signal, said volatile memory (RAM) (13) being controlled to "store" a subsequent signal upon dissimilarity of the compared data words or signals.

6. Method acording to claim 1, wherein the digital signals comprise data words having a plurality of bits; and
the dissimilarity comprises, in digital form, a value of (1) (one) at the least significant bit.

7. Method according to claim 3, wherein the digital signals comprise data words having a plurality of bits; and
said incremented step comprises adding the value of 1 (one) to the least significant bit.

8. Method according to claim 5, wherein the digital signals comprise data words having a plurality of bits; and
said incremented step comprises adding the value of 1 (one) to the least significant bit of the digitized data word.

9. Method according to claim 3, wherein the digital signals comprise data words having a plurality of bits; and
the step of digital/analog reconversion comprises digital/analog reconverting the data word stored in the volatile memory (RAM) (13).

10. System to reduce or eliminate noise quantitizing errors upon digital transmission of analog signals by analog/digital (A/D) conversion and subsequent digital/analog (D/A) reconversion of digitized signals into analog signals, with minimum or no distortion between the original analog signals and the reconverted analog signals, comprising
an A/D converter (12) to convert analog signals into digitized data words;
D/A converters (17-20) converting digitized data words into analog signals (W', X', Y', Z');
transmission means transmitting digitized data words from the A/D converter (12) to the D/A converters;
and further comprising, in accordance with the invention,
a random access memory (RAM) (13) storing digitized data words and connected in and forming part of the transmission means between the A/D converter (12) and the D/A converters (17-20);
adding means (15; 24) connected to receive digitized data words from the output of the RAM (13) and adding an incremental value to signals derived from the RAM (13);
a comparator (16) having one input connected to the output of the adder means (15) and the second input connected to the output of the RAM (13) and providing a comparison output at a comparison output terminal (22), said comparator controlling the RAM (13) to store a subsequent signal upon detection of non-congruence of the incremented signal and a signal derived from the RAM (13); and
means (23) controlled by the comparator for controlling the D/A converters (17,20) to provide a changed analog output only if said non-congruence has been detected;
the D/A converters (17-20) being coupled to and providing the reconverted analog signal output.

11. System according to claim 10, wherein the adder means and the comparator are formed by a single programmable read-only memory (PROM) (24).

12. System according to claim 10, wherein the adder means adds a predetermined increment to the least significant bit of the digitized data word.

13. System according to claim 12, wherein said predetermined increment is a value of 1.

* * * * *